United States Patent [19]
Kimura et al.

[11] Patent Number: 4,641,279
[45] Date of Patent: Feb. 3, 1987

[54] SEMICONDUCTOR MEMORY DEVICE HAVING A DUMMY CELL AND A MEMORY CELL WHICH IS TWICE THE SIZE OF THE DUMMY CELL

[75] Inventors: Katsutaka Kimura, Sagamihara; Ryoichi Hori, Tokyo; Kiyoo Ito, Higashikurume; Hideo Sunami, Tokyo, all of Japan

[73] Assignee: Hitachi, Ltd., Tokyo, Japan

[21] Appl. No.: 587,080

[22] Filed: Mar. 7, 1984

[30] Foreign Application Priority Data

Mar. 7, 1983 [JP] Japan .................................. 58/35812

[51] Int. Cl.[4] ............................................ G11C 11/40
[52] U.S. Cl. .................................... 365/149; 365/210; 365/186; 357/55
[58] Field of Search ............... 365/149, 210, 186, 203; 357/55, 23.6

[56] References Cited

U.S. PATENT DOCUMENTS

| | | | |
|---|---|---|---|
| 3,678,473 | 7/1972 | Wahlstrom | 365/149 |
| 4,138,740 | 2/1979 | Itoh | 365/210 |
| 4,327,476 | 5/1982 | Iwai et al. | 357/23.6 |
| 4,353,086 | 10/1982 | Jaccodine et al. | 357/55 |

FOREIGN PATENT DOCUMENTS 53-76686  7/1978  Japan .................................. 357/236

Primary Examiner—Terrell W. Fears
Attorney, Agent, or Firm—Antonelli, Terry & Wands

[57] ABSTRACT

In a semiconductor memory device including memory and dummy cells connected to groups of data lines, word lines and dummy word lines for selecting the memory and dummy cells, respectively, and a signal detector for differentially amplifying the read signal from the memory cell selected by the signal of the word line and a reference signal from the dummy cell, the improvement wherein the memory cell capacitor consists of two capacitors, each having substantially the same structure as a dummy cell capacitor and connected in parallel with the other.

5 Claims, 19 Drawing Figures (a)

(b)

(a)

(b)

(a)

(b)

(c)

SEMICONDUCTOR MEMORY DEVICE HAVING A DUMMY CELL AND A MEMORY CELL WHICH IS TWICE THE SIZE OF THE DUMMY CELL

BACKGROUND OF THE INVENTION

This invention relates generally to a semiconductor memory device, and more particularly to an improvement in a memory cell used for storing information in a dynamic type MOS memory.

A dynamic MOS memory forming one memory cell by one transistor has been known in the past. FIG. 1 of the acbompanying drawings illustrates the construction of such a memory cell. The memory cell consists of a capacitor ($C_{MC}$) 1 for storing charge and an MOS transistor 2 for switching. The drain of this transistor is connected to a data line 3 and its gate is connected, to a word line 4. One of the ends of the capacitor is connected to the source of the MOS transistor with the other end being connected to a plate 5 which applies a predetermined potential (e.g. power source voltage $V_{cc}$) to form the capacitance.

FIG. 2 schematically illustrates part of a memory cell array. A dummy cell (DC) 6 ($6_n$, $\overline{6_n}$) has a function of generating a reference signal when a delicate read signal from a memory cell (MC) $7(7_n, \overline{7_n})$ is differentially amplified by a signal detector (sensor amplifier; SA) 8. The memory cell array has a construction such that when the memory cell $7_n$ connected to either one of a pair of data lines ($D_n$, $\overline{D_n}$)$3_n$, $\overline{3_n}$ is selected, for example, to the word line (W) $4_m$ on the side of $3_n$, by a word line driving pulse $\phi w$ from an address decoder (not shown), the dummy cell $\overline{6_n}$ connected to the dummy word line (DW) $\overline{9}$ on the other side $\overline{3_n}$ is selected by a dummy word line driving pulse $\phi_{DW}$. In the drawing, reference numeral 10 represents a dummy memory cell clear line through which a pulse signal $\phi_p$ for discharging the dummy cell capacitor $C_{DC}$ 11 to a predetermined potential, e.g., to a ground potential, is applied. Reference numeral 12 represents a switching MOS transistor constituting the dummy cell, and reference numeral 13 does a clear MOS transistor. The dummy cell capacitor $C_{DC}$ 11 is interposed between the MOS transistor 12 and a plate 14 for applying a predetermined potential, in the same way as the memory cell capacitor $C_{MC}$ 1 described above.

In the circuit construction shown in FIG. 2, the reference signal by the dummy cell is set to the almost intermediate level between a "1" read signal and a "0" read signal from the memory cell, so that the capacitors $C_{MC}$1 and $C_{DC}$ 11 of the memory and dummy cells are set so as to satisfy the relation $C_{DC} \simeq \frac{1}{2} C_{MC}$.

The memory and dummy cell capacitors $C_{MC}$, $C_{DC}$ are formed generally by diffusion layer type capacitors or gate oxide film capacitors of MOS transistors, and their values are proportional to the area of the region that forms the capacitance. To obtain the relation $C_{DC} \simeq \frac{1}{2} C_{MC}$, therefore, the area of the region that forms the dummy cell capacitor is set to be substantially the half of the area of the region that forms the capacitor of the memory cell. (This arrangement is disclosed in U.S. Pat. No. 3,678,473, for example.)

FIG. 3 shows in a plan view an example of a memory cell 7 using an n-channel MOS transistor. FIG. 4 is a sectional view taken along line A —A of FIG. 3. Among an active region 16 encompassed by a thick field oxide film 15 of at least 100 nm, a region 17 which is below plate 5 made of polycrystalline Si and in which a gate oxide film consisting of silicon dioxide generally forms the memory cell capacitor. The plate 5 is selectively removed at the portion at which the switching MOS transistor is to be formed and at the portion of a contact hole 18 which connects the drain on the Si substrate with the data line 3. The word line 4 represented by polycrystalline silicon, molybdenum silicide or refractory metal (Mo and W) is deposited to the portion, forming the switching MOS transistor 2. In FIG. 4, reference numeral 19 represents a p-type Si substrate; 21 is a first inter-layer insulating film formed by oxidizing the polycrystalline Si plate 5; 22 is a second interlayer insulating film consisting of P-containing PSG which is formed by a so-called "CVD" process; and 23 is an n+ diffusion layer formed by implanting P or As to the silicon substrate. The switching MOS transistor 2 is formed by 23A and 23B.

The dummy cell 6 has the same construction as the memory cell 7, but due to the relation $C_{DC} \simeq \frac{1}{2} c_{MC}$ described above, the area of the region forming the dummy cell capacitor $C_{DC}$ is the half of the area of the region 17 forming the memory cell capacitor $C_{MC}$.

To simplify the illustration, FIG. 5 shows only the region that forms the capacitor. In order to have the description more easily understood, the drawing shows the case in which the region forming the capacitor is square. FIG. 5a shows the region 24 that forms the dummy cell capacitor $C_{DC}$ and FIG. 5b shows the region 17 that forms the memory cell capacitor $C_{MC}$. In view of the relation $C_{DC} \simeq \frac{1}{2} C_{MC}$ described above, these regions 24 and 17 are determined so as to satisfy the relation $L_D \times L_D = (\frac{1}{2} L_M \times L_M)$ where $L_D \times L_D$ is the area of the region 24 and $L_M \times L_M$ is the area of the region 17. Here, $L_D$ and $L_M$ are dimensions after finish.

It has been clarified, however, that the prior art techniques described above cause the following critical problem due to the miniaturization of the memory cell pattern which is brought forth as a result of the increase of the scale of the memory capacity in recent years.

In other words, the miniaturization of the memory pattern limits the area allowed for the formation of the memory cell capacitor $C_{MC}$ to an extremely small value. The dummy cell capacitor $C_{DC}$ must be formed in a further smaller area because of the afore-mentioned relation $C_{DC} \simeq \frac{1}{2} C_{MC}$. Accordingly, they must be designed in a size which is close to the minimum possible limit of photoetching techniques used for the production process of semiconductor devices. Since the fabrication word is carried out in a region close to its limit, the variance of work is extremely great, and it becomes difficult to constantly keep the relation $C_{DC} \simeq \frac{1}{2} C_{MC}$.

The problem with the prior art techniques will now be described with reference to FIG. 5. If the change quantity of the finish size due to the work variance is $\Delta L$, the area ($S_{DC}$) of the region 25 for forming the dummy cell capacitor $C_{DC}$ becomes $(L_D - \Delta L) \times (L_D - \Delta L)$, and the area ($S_{MC}$) for forming the memory cell capacitor $C_{MC}$ becomes $(L_M \times \Delta L) \times (L_M - \Delta L)$. Accordingly, the ratio of $S_{DC}$ to $S_{MC}$ becomes as follows:

$$\frac{S_{DC}}{S_{MC}} \simeq \frac{1}{2} \left(1 - 0.6 \times \frac{\Delta L}{L_D}\right)$$

Due to $\Delta L$, it becomes difficult to constantly keep the relation $S_{DC} \simeq \frac{1}{2} S_{MC}$, that is $C_{DC} \simeq \frac{1}{2} C_{MC}$, and this becomes a critical problem for the operation of the memory.

The reduction of $L_D$ means the increase of the ratio $\Delta L/L_D$ and becomes a problem to be solved in order to accomplish the miniaturization of the memory.

SUMMARY OF THE INVENTION

In order to solve the problems described above, the present invention is directed to provide a semiconductor memory cell having improved and excellent electric characteristics.

To accomplish the object described above, the present invention forms the memory cell capacitor $C_{MC}$ by connecting two capacitors each having substantially the same structure as the dummy cell capacitor $C_{DC}$ in parallel with each other to reduce the adverse influence of the work variance described above.

DESCRIPTION OF THE PREFERRED EMBODIMENTS

Hereinafter, the present invention will be described in further detail with reference to preferred embodiments thereof.

Figure 4:
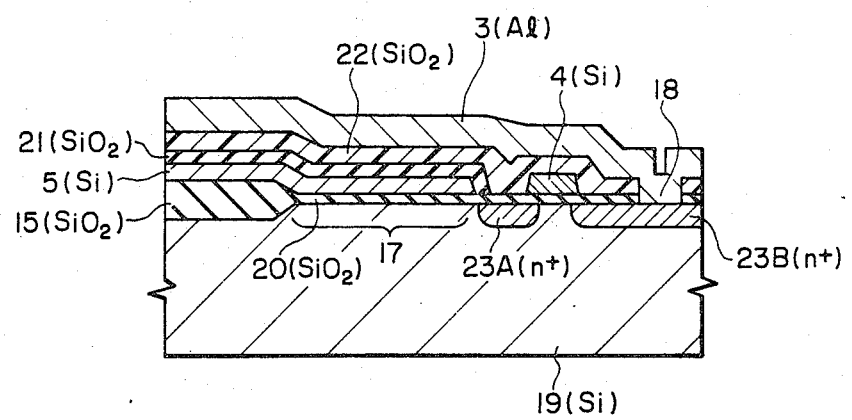
FIG. 4 is a sectional view taken along line A—A of FIG. 3.
Figure 5:
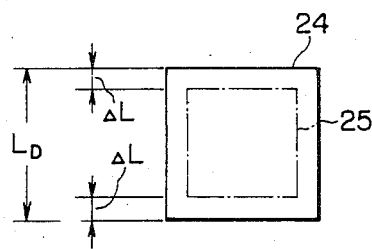
FIG. 5 including parts (a) and (b) is a plan view showing conventional memory cell and dummy cell capacitors.
Figure 5:
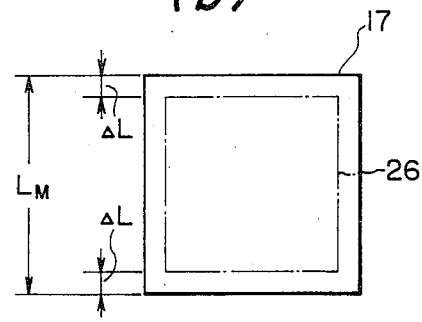
Figure 6:
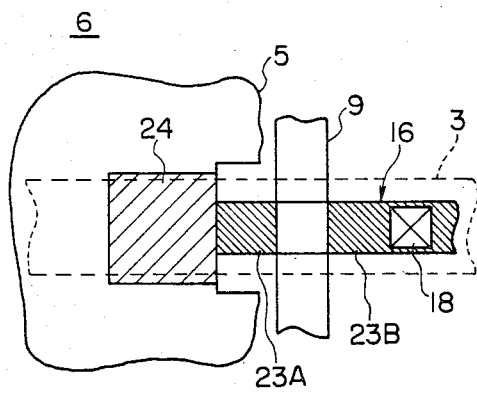
FIGS. 6(a) and 6(b) are plan views showing the dummy cell and memory cell in accordance with one embodiment of the present invention, respectively.
Figure 6:
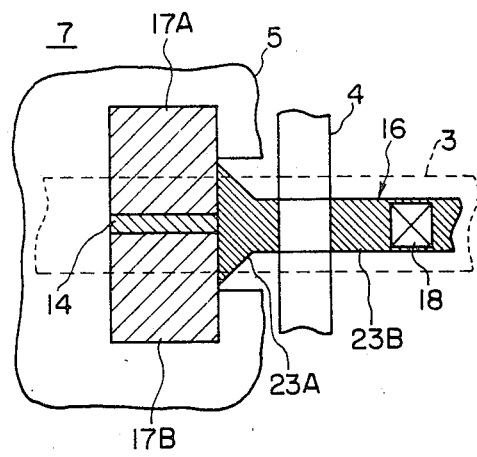

FIG. 6 shows a dummy cell (FIG. 6(a)) and a memory cell (FIG. 6(b)), each using an n-channel MOS transistor having the sectional structure shown in FIG. 4, in a plan view.

Figure 1:
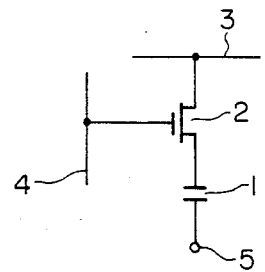
FIG. 1 is a circuit diagram showing a conventional memory cell.
Figure 2:
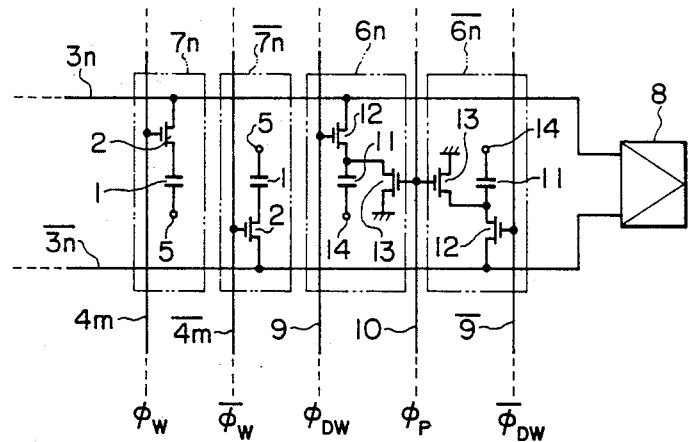
FIG. 2 is a circuit diagram showing the principal portions of conventional semiconductor memory device.
Figure 3:
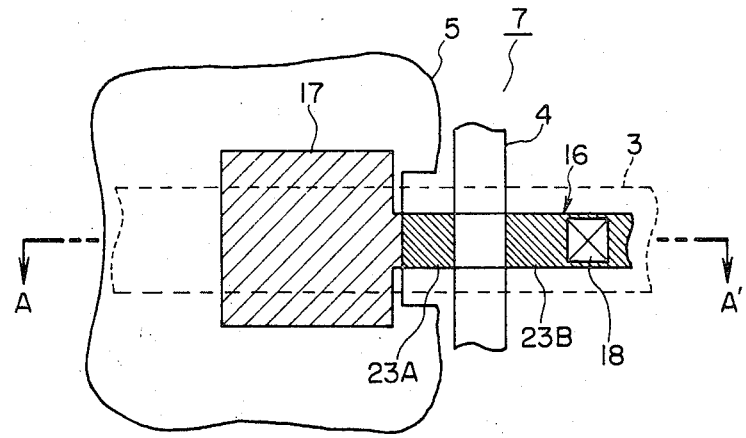
FIG. 3 is a plan view of the conventional memory cell.

In these drawings, like reference numerals are used to identify like constituents as in FIGS. 3 and 4. In FIG. 6(a), reference numeral 9 represents a dummy word line formed by polycrystalline silicon. The MOS transistor 13 for clearing (see FIG. 2) is not shown for simplification. The portion of the dummy cell 6 shown in FIG 6(a) has the same construction as the memory cel shown in FIG. 4.

The memory cell 7 shown in FIG. 6(b) is differen from the memory cell shown in FIG. 4 in that the region that forms the capacitor is divided into two regions 17A and 17B. These regions are separated from each other by disposing a thick oxide film (field oxide film) a the portion interposed between them. One of the electrodes of each of the capacitors formed in these regions is an inversion layer region formed on the substrate surface of each region 17A, 17B in the same way as in the prior art devices. The diffusion layer 23A of the switching transistor of the memory cell is connected to these inversion layer regions. Thus, one of the electrodes of the capacitor formed in the region 17A is connected to one of the electrodes of the capacitor formed in the region 17B. The plate 5 is disposed in common on these regions 17A, 17B and on the region 14 between the two regions 17A, 17B. The plate 5 serves as a common electrode for the two capacitors formed on the two regions 17A, 17B.

The regions 17A, 17B and the region 24 that forms the capacitor of the dummy cell have substantially the same construction and dimension. Accordingly, even if the variance of work occurs, the regions 24, 17A, 17B have substantially the same variance, so that it becomes possible to keep the ratio of the dummy cell capacitor $C_{DC}$ to the memory cell capacitor $C_{MS}$ at 1:2. Although the region that forms the dummy cell capacitor $C_{DC}$ is square in this embodiment, it may have an arbitrary shape. In such a case, two regions forming the dummy cell capacitor $C_{DC}$ and having an arbitrary shape may be aligned so as to form the memory cell capacitor $C_{MC}$.

Figure 7:
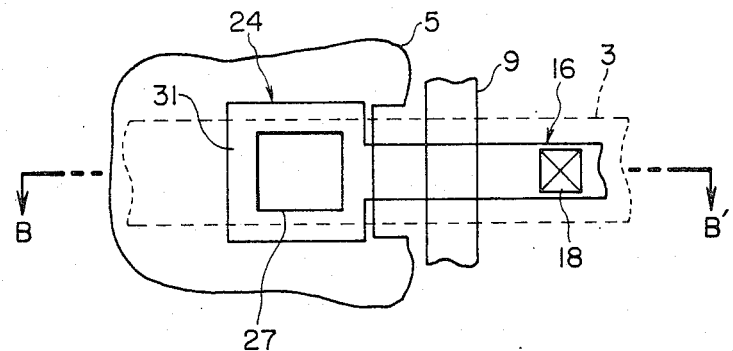
FIG. 7, including 7a, 7b, and 7c is plan, perspectrve and sectional views showing the dummy cell capacitor in accordance with another embodiment of the present invention.
Figure 7:
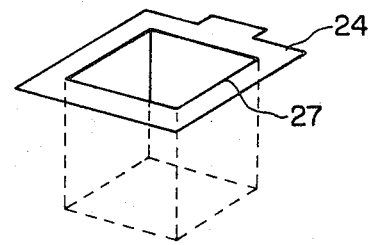
Figure 7:
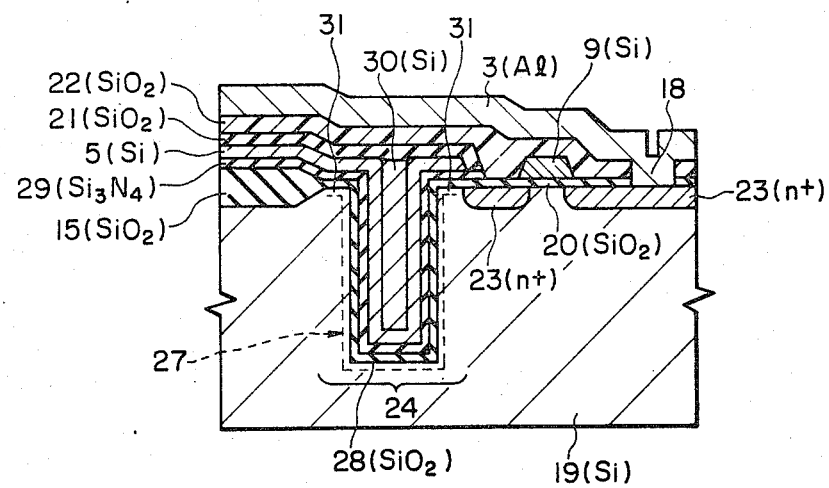
Figure 8:
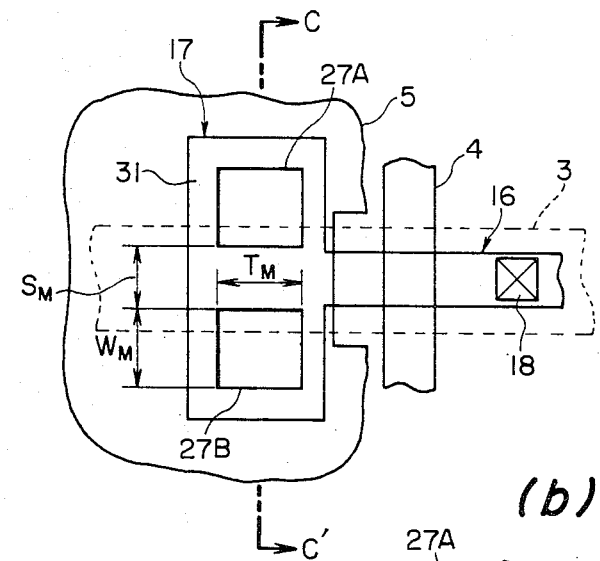
FIG. 8 including 8a, 8b and 8c is plan, perspective and sectional views of the memory cell capacitor shown in FIG. 7.
Figure 8:
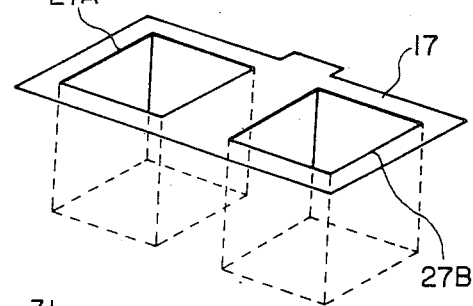
Figure 8:
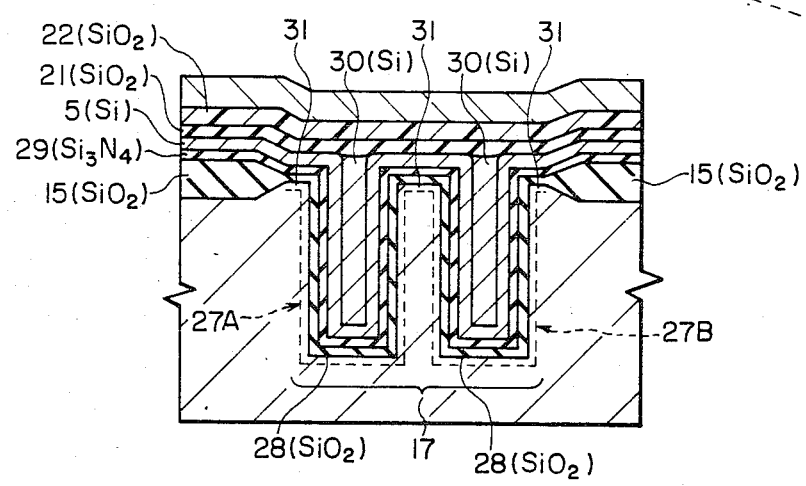

FIGS. 7 and 8 shows another embodiment of the present invention in which a groove type capacitor known from Japanese Patent Laid-Open No. 57779/1974 is applied to the invention. FIG. 7(a) is a plan view of the dummy cell. FIG. 7(b) shows three-dimensionally the region that forms the dummy cell capacitor $C_{DC}$, with FIG. 7(c) being a section taken along line B–B' of FIG. 7(a). In these drawings, the transistor for clearing is not shown for simplification. FIG. 8(a) is a plan view of the memory cell. FIG. 8(b) shows three-dimensionally the region that forms the memory cell capacitor $C_{MC}$, with FIG. 8(c) being a section taken along line C–C' of FIG. 8(a). In FIGS. 7(a) through 7(c) and 8(a) through 8(c), like reference numerals are used to identify like constituents as in FIGS. 3 and 4.

In this embodiment, the capacitor portions for the dummy and memory cells are disposed in a region including the side walls of grooves 27, 27A, 27B defined in the silicon substrate. As shown in FIG. 7(c), one etch groove 27 is defined in the region 24 at which the dummy cell capacitor $C_{DC}$ is to be formed, while two etch grooves 27A, 27B are defined in the region 17 at which the memory cell capacitor $C_{MC}$ is to be formed, as shown in FIG. 8(c). These two grooves 27A, 27B have the same shape as that of the groove 27. In FIG. 7(c), reference numerals 28 and 29 represent insulating films of the capacitor portions that are laminated on the surfaces of the etch grooves 27, 27A, 27B. The insulating films may be composed of thermally oxidized $SiO_2$, thermally nitrided $Si_3N_4$, $Si_3N_4$ formed by CVD, or a single- or multi-layered structure of $Ta_2O_5$, $Nb_2O_5$, $GrO_2$ or the like by CVD or reactive spattering. The films 28 and 29 in this embodiment consist of SiO₂ and Si₃N₄, respectively.

In FIG. 7(c), reference numeral 5 represents the plate consisting of polycrystalline silicon. The plate is stacked on the insulating film 29 and serves as one of the electrodes of the capacitors that are formed in the grooves 27, 27A, 27B, respectively. In the memory cell, this plate 5 is disposed in common for the two grooves 27A and 27B. Reference numeral 30 represents doped polycrystalline Si for embedding the grooves 27, 27A, 27B. Reference numeral 9 represents a dummy word line consisting of polycrystalline Si. The structure of the device is the same as the device shown in FIG. 4. In this embodiment, the other of the electrodes of each capacitor formed in the groove 27, 27A, 27B is formed by an inversion layer region that is formed on the inner wall of the groove.

The capacitors formed by the grooves 27A, 27B are connected in parallel with each other by the portion of the inversion layer region 31 on the surface of the substrate and between these grooves. Although the portion of the inversion layer region 31 has a capacitance, it can be practically neglected because the capacitance at the groove portions 27A, 27B is great. Similarly, the capacitance of the inversion layer region 31 on the substrate surface can also be neglected in the dummy cell. Accordingly, the memory cell capacitor becomes analogous to one that is formed by connecting two capacitors having the same construction as the dummy cell capacitor in parallel with each other.

In accordance with this embodiment, the capacitance of the memory cell capacitor $C_{MC}$ can be always kept substantially twice the capacitance of the dummy cell capacitor without being adversely affected by the variance of work. If the side walls of the groove cut into the Si substrate are used for forming the capacitor as in this embodiment, the capacitance of the side wall is proportional to the peripheral length and depth of the groove. If the shape of the groove forming the memory cell capacitor $C_{MC}$ is different from that of the groove forming the dummy cell capacitor $C_{DC}$, it becomes difficult to constantly keep the value of the memory cell capacitor $C_{MC}$ twice that of the dummy cell capacitor $C_{DC}$ due to the variance of work of the peripheral length and depth of the groove. Since the shape of the groove forming the memory cell capacitor $C_{MC}$ is the same as that of the groove forming the dummy cell capacitor $C_{DC}$ in this embodiment, on the other hand, the relation $C_{DC} \delta \frac{1}{2} C_{MC}$ can be maintained even if the change of the groove occurs due to the variance of work.

In the embodiment described above, the values of the memory cell capacitor $C_{MC}$ and dummy cell capacitor $C_{DC}$ are substantially determined by the etch grooves, and the capacitance of the invention region layer 31 on the surface is nelected. Where the variance of work at the portion of the inversion layer region 31 becomes a problem, however, the memory cell may be formed in such a fashion that two surface inversion layer regions each having substantially the same structure and size as those of the surface inversion layer region 31 of the dummy cell are disposed. In this case, the two inversion layer regions of the resulting memory cell are separated from each other by a thick insulating film, and a part of each region is connected to the n⁺ diffusion layer of the switching transistor. As a result, two capacitors each having exactly the same structure of the groove and surface inversion layer region as those of the dummy cells are formed in the memory cell, so that any adverse influences that might occur due to the variance of work can be further reduced.

Since the groove for forming the memory capacitor is divided into the two grooves in this embodiment, the following effect can be obtained.

Figure 9:
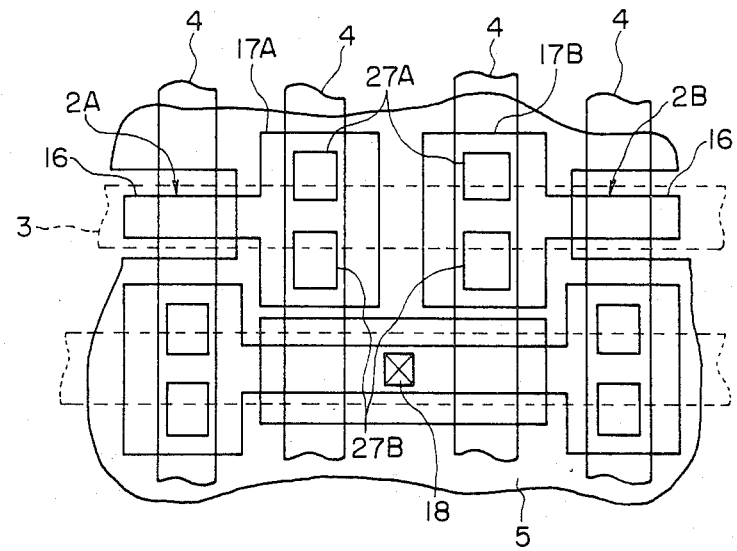
FIG. 9 is a plan view showing the disposition of the memory cell shown in FIG. 8.

FIG. 9 shows the arrangement of the memory cell in accordance with this embodiment. In the drawing, the memory cell capacitor-forming regions 17A and 17B are shown disposed so as to oppose each other, and the grooves 27A, 27B of the region 17A oppose the grooves 27A, 27B of the region 17B. The switching transistors 2A and 2B are disposed on the opposite sides, respectively. The word line 4 crosses the active region 16 perpendicularly thereto, and the point of interection acts as the gates of the transistors 2A, 2B. The disposing direction of the grooves 27A, 27B is the same as the extending direction of the word line 4. For, the capacitor region is extended in the direction of the word line in order to reduce the spacings between the word lines, and to facilitate the layout. The data line 3 extends in a direction crossing the word line 4 at right angles, and passes immediately above the active region 16. The data line is connected to the n⁺ diffusion layer of the switching transistor by a contact 18. In the ordinary memory cells of the type in which the groove that forms the memory cell capacitor is not divided as is in the present invention, however, the following problem occurs.

Figure 10:
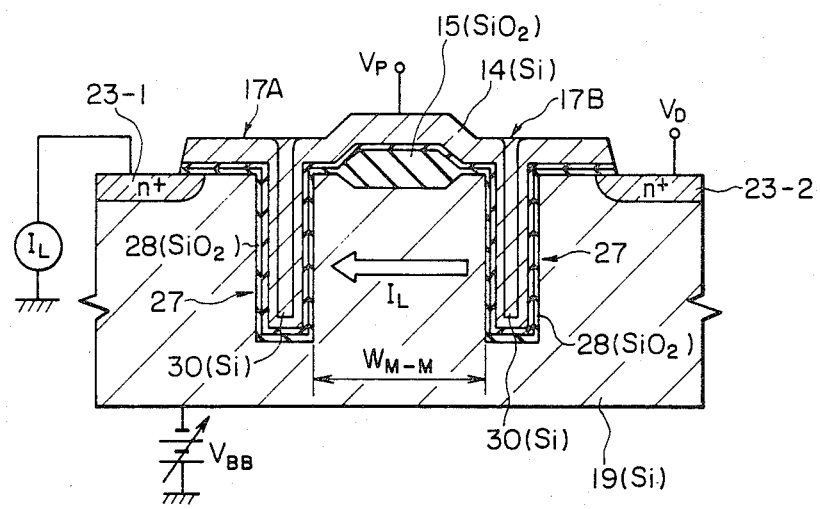
FIG. 10 is a schematic view useful for explaining a leakage current.

FIG. 10 is a drawing useful for explaining the problem described above.

As shown in this drawing, a leakage current $I_L$ flows at a deep portion of the Si substrate 19. The drawing is a schematic sectional view in which one 23-1 of the two drains of adjacent cells is regarded as the source with the other being regarded as the drain 23-2. The gate of the transistor is regarded as the plate 14. In the ordinary transistors in which the gate oxide film is as thin as from 5 to 100 nm, the drain current $I_D$ flows substantially through the interface between the Si substrate and the gate oxide film, but in the transistor shown in FIG. 10, the leakage current $I_L$ flows inside the Si substrate 19 because the field oxide film 15 as the gate oxide film is as thick as 800 nm.

Since the substrate bias $V_{BB}$ is applied to the Si substrate 19, it lifts up the potential, so that the leakage current $I_L$ does not flow through the bottom portion of the groove inside the Si substrate, but is eventually entrapped at the intermediate depth portion of the groove. The flow of the leakage current through the grooves means the loss of the information that is stored in the form of charge.

The leakage current depends greatly upon the opposing length $W_M$ (FIG. 8) of the opposing grooves, the distance between the grooves $W_{M-M}$ (FIG. 10) and the impurity concentration of the Si substrate 19.

Figure 12:
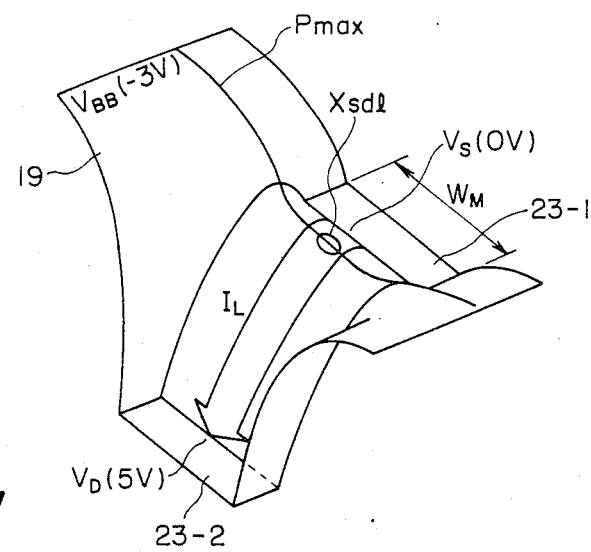
FIG. 12 is a schematic view showing the potential distribution on an Si substrate and useful for explaining the dependence of the leakage current $I_L$ upon the opposing length $W_M$.
Figure 11:
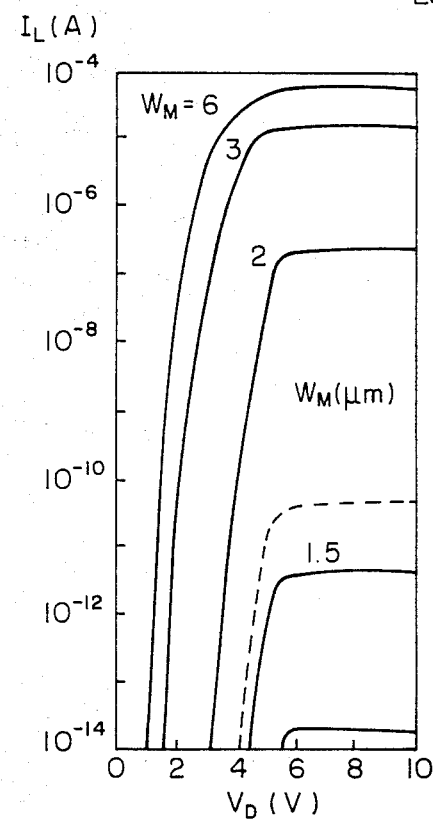
FIG. 11 is a diagram showing the dependence of the leakage current $I_L$ upon an opposing length $W_M$.

FIG. 11 illustrates the dependence of the leakage current $I_L$ upon $W_M$ when $W_{M-M}$ is kept fixed (at 1.6 μm). As can be seen clearly from this diagram, the leakage current drops when $W_M$ is small. As $W_M$ becomes smaller, the potential between the grooves is lifted up by the potential of the surrounding Si substrate, so that the leakage current $I_L$ drops. As can be seen from the three-dimensional potential distribution of FIG. 12, the portion $P_{max}$ between the source 23-2 and the drain 23-1, which has the highest potential, describes a ridgeline, and the potential $P_{sdl}$ at the lowest potential portion $X_{sdl}$ is lifted up by the potential $V_{BB}$ of the Si substrate 19. Accordingly, $P_{sdl}$ rises essentially if $W_M$ becomes small.

Since this embodiment devides the groove, it can minimize $W_M$. If a groove having $T_M=1$ μm and $W_M=1$ μm is divided into two grooves, for example, the leakage current $I_L$ becomes such as represented by dash line in FIG. 11 if $S_M=1$ μm (FIG. 8). If the groove having the same capacitance is formed without changing the region necessary for the memory cell capacitor and without dividing the groove, $T_M$ must be 1 μm and $W_M$ must be 3 μm. In this case, the leakage current $I_L$ becomes extremely great, as can be seen clearly from FIG. 11. In accordance with this embodiment, $W_M$ can be reduced at the same area and the same capacitance, and the information stored is not lost by the leakage current.

Figure 13:
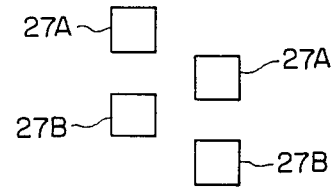
FIG. 13 is a plan view showing the memory cell in accordance with still another embodiment of the present invention.

FIG. 13 shows still another embodiment of the present invention. In this embodiment, the grooves 27A, 27B of the opposing regions 17A, 17B are deviated in the direction of the word line. This embodiment can reduce further the leakage current because the distance $W_{M-M}$ between the grooves can be increased.

In the embodiments shown in FIGS. 7, 8 and 11, the groove for forming the dummy cell capacitor $D_{DC}$ is only one, but in accordance with the gist of the present invention, the groove need not be one. If the dummy cell capacitor $C_{DC}$ is formed by two grooves, the memory cell capacitor $C_{MC}$ may be formed by four grooves. Generally, therefore, the memory cell capacitor $C_{MC}$ may be formed by 2n grooves if the dummy cell capacitor $C_{DC}$ is formed by n grooves. The groove may be of a projection type in place of the recessed type such as the groove, at times.

The embodiments described above deal with the memory cell of a so-called "folded bit line" type in which data line pairs to be connected to the signal detector (sense amplifier SA) 8 are arranged parallel, but the present invention can also be applied to a memory cell of a so-called "open bit line" type in which the data line pairs are disposed spatially separately on the right and left of the sense amplifier SA 8.

As described above, the present invention constitutes the memory cell capacitor by two regions each having substantially the same shape as the region forming the dummy cell capacitor. Even when the memory cell is miniaturized, therefore, the present invention can completely solve the problem with the prior art devices in that the operation margin of the memory cell drops due to the variance of work.

The range of application of the present invention is not particularly limited to the foregoing embodiments but can be worked naturally in various modifications without departing from the spirit and scope of the invention. For example, the embodiments described above handle the n-channel MOS transistors by way of example, the p-channel MOS transistors can be also used by inverting all the conductivity types. One end each of the memory and dummy cell capacitors is connected to $V_{CC}$ in the embodiments described above, but the present invention can also be applied to capacitors of the other types, such as one in which one end of the capacitor is connected to the ground potential.

What is claimed is:

1. A semiconductor memory device comprising:
   a plurality of memory cells connected to a plurality of data lines, respectively, and having first capacitors for storing information;
   a plurality of dummy cells connected to said data lines, respectively, and having second capacitors having a capacitance which is substantially half of a capacitance of said first capacitors; and
   means connected to selected first and second data lines of said data lines, for differentially detecting signals on said first and second data lines when one of said memory cells connected to said first data line is selected and one of said dummy cells connected to said second data line is selected,
   said first capacitor being comprised of two capacitors each having the same structure as said second capacitor and connected in parallel with each other.

2. The semiconductor memory device as defined in claim 1 wherein said second capacitor is comprised of a first groove formed on a semiconductor substrate, a first insulating film formed on a sidewall of said first groove and a first capacitor electrode laminated on said first insulating film, and defining a conductive layer, and wherein said first capacitor is comprised of second and third grooves juxtaposed with each other on said semiconductor substrate, second and third insulating films formed on sidewalls of said second and third grooves, respectively, and a common second capacitor electrode disposed on said second and third insulating films, and defining conductive layers connected conductively with each other, below sidewalls of said second and third grooves, respectively.

3. The semiconductor memory device as defined in claim 2 wherein each of said memory cells is comprised of a field effect transistor connector said second capacitor to a corresponding data line, the gate of said transistor is connected to one corresponding word line, its source and drain are arranged in a direction in which the corresponding data lines extend, and said second and third grooves of each of said memory cells are juxtaposed in the direction crossing said data lines at right angles.

4. The semiconductor memory device as defined in claim 2 wherein said second and third groove portions belonging to each of said first and second memory cells adjacent each other are juxtaposed in the same direction but at different positions in the same direction.

5. The semiconductor memory device as defined in claim 4 wherein said direction is one that is perpendicular to the extending directions of said data lines.

* * * * *